United States Patent [19]
Murden et al.

[11] Patent Number: 5,825,319
[45] Date of Patent: Oct. 20, 1998

[54] HIGH SPEED WIDE BANDWIDTH DIGITAL PEAK DETECTOR

[75] Inventors: Franklin M. Murden, Greensboro; Harvey J. Ray, Winston Salem, both of N.C.

[73] Assignee: Analog Devices, Inc., Norwood, Mass.

[21] Appl. No.: 772,361

[22] Filed: Dec. 23, 1996

[51] Int. Cl.$^6$ ................................................. H03M 1/44
[52] U.S. Cl. ........................................... 341/132; 341/161
[58] Field of Search .................................. 341/155, 156, 341/161, 132

[56] References Cited

U.S. PATENT DOCUMENTS

| | | | |
|---|---|---|---|
| 4,165,508 | 8/1979 | Barter | 340/347 |
| 4,211,999 | 7/1980 | Clarke et al. | 340/347 |
| 4,876,697 | 10/1989 | Whitfield | 375/22 |
| 4,990,912 | 2/1991 | Selwa | 341/132 |
| 5,109,225 | 4/1992 | Morita | 341/5 |
| 5,254,995 | 10/1993 | Hantke | 341/159 |
| 5,539,402 | 7/1996 | Bozeman | 341/132 |

OTHER PUBLICATIONS

*Analog–Digital Conversion Handbook*, Prentice–Hall, Daniel Sheingold, Editor, 1986, pp. 129–131 and 420–427.

*Primary Examiner*—Marc S. Hoff
*Attorney, Agent, or Firm*—Koppel & Jacobs

[57] ABSTRACT

A high speed wide bandwidth peak detector uses multiple peak detection stages that detect different sub-ranges of a full-scale analog signal range. Splitting the peak detector into multiple stages reduces the number of taps in each stage, and hence their capacitance, which increases their bandwidth. The number of taps can be further reduced by using a non-uniform resolution of the desired full-scale amplitude range. In the preferred embodiment, identical peak detection stages are separated by fixed gain stages that map the different sub-ranges to respective detection stages. This approach minimizes the effects of offset errors in the individual stages but requires gain stages that have wider bandwidths than the detection stages and which can be closely matched to maintain amplitude resolution.

9 Claims, 3 Drawing Sheets

| ΔV | 1st stage Latch | ΔV(+18) | 2nd stage Latches | RSSI |
|---|---|---|---|---|
| >250mv | 111 | >2v | 11 | 101 |
| >125mv | 011 | >1v | 11 | 100 |
| >62.5mv | 001 | >500mv | 11 | 011 |
| >31.25mv | 000 | >250mv | 11 | 010 |
| >15.62mv | 000 | >125mv | 01 | 001 |
| >7.8mv | 000 | >62.5mv | 00 | 000 |

Table 1

HIGH SPEED WIDE BANDWIDTH DIGITAL PEAK DETECTOR

BACKGROUND OF THE INVENTION

1. Field of the Invention

This invention relates to peak detection circuitry and more specifically to a multi-stage digital peak detector with improved bandwidth.

2. Description of the Related Art

Communications systems transmit and receive analog signals through media such as the atmosphere, wire-to-wire, cable and optic fiber networks. Variations in the media can cause the amplitude of the received signal to vary by 30 dB over a 90 dB range. To maximize amplitude resolution and avoid clipping, the received signal level must be adjusted so that its amplitude approximately matches the input range of a high resolution analog-to-digital converter (ADC). Peak detection circuits detect peak amplitudes of the received signal and adjust the path gain so that the signal's amplitude remains in a desired range. Known peak detectors are not capable of operating on high frequency signals, IF band or higher, while maintaining high amplitude resolution, 10 bits or higher. Peak detection circuits can also be used in control systems such as temperature sensor. When the detected temperature exceeds different threshold levels, the sensor triggers different responses in a cooling or heating system.

The "Analog-Digital Conversion Handbook" Prentice-Hall, Daniel Sheingold, Editor, 1986, pages 129–131 discloses a digital peak-follower tracks the amplitude of an analog signal and holds its highest value until it is reset. The peak-follower is implemented by removing the down-counter from a sample-hold amplifier (SHA). As a result, the SHA counts up when the analog signal is greater than the previous highest amplitude but does not count down when the signal amplitude is reduced. A hysteresis circuit is used to provide a small measure of noise immunity. Because the SHA only counts up by one level at a time, the peak level can lag behind the actual peak amplitude, which can cause clipping or underresolution. Furthermore, the SHA has a low pass structure such that it is very difficult to maintain high amplitude resolution over a wide frequency band.

Sheingold also discloses a number of designs for high speed analog-to-digital conversion (pages 420–427). An all-parallel "flash" converter offers the fastest throughput of available ADC designs. The converter employs $2^n-1$ latched comparators and a resistive voltage divider that provides the reference voltages for each comparator. The reference voltage for each comparator is one least-significant bit higher than the reference voltage for the comparator immediately below it. All comparators which have a reference voltage below the level of the input signal will assume logic "1" output. The remaining comparators have a logic "0" output. Decoding logic converts the comparators's outputs into a Gray-scale code that represents the value of the analog signal. The flash converters have a relatively low bandwidth due to the total resistance in the resistive ladder and the total capacitance as seen at the last of the $2^n-1$ taps. Furthermore, the number of comparators and associated logic limit the amplitude resolution of the flash converter.

Subranging converters provide higher resolution than flash converters with fewer comparators and simpler logic but sacrifice high speed operation. The subranging converter encodes the signal with a 6-bit flash converter. These most significant bits (MSBs) are stored in a register and also applied to a DAC. The output of the DAC is subtracted from the delayed signal to produce a residue signal. A 7-bit flash converter encodes the residue. These least significant bits are stored in the register and appended to the MSBs to form the output word. The timing control and generation of the residue limit the bandwidth and amplitude accuracy of this architecture.

SUMMARY OF THE INVENTION

In view of the above problems, the present invention provides a high speed wide bandwidth peak detector This is accomplished by using multiple peak detection stages that detect different sub-ranges of a full-scale analog signal range. Splitting the peak detector into multiple stages reduces the resistance and number of taps in each stage, which increases their bandwidth. The number of taps can be further reduced by using a non-uniform resolution of the desired full-scale amplitude range. In the preferred embodiment, identical peak detection stages are separated by fixed gain stages that map the different sub-ranges to respective detection stages. This approach minimizes the effects of offset errors in the individual stages but requires gain stages that have wider bandwidths than the detection stages and which can be closely matched to maintain amplitude resolution.

These and other features and advantages of the invention will be apparent to those skilled in the art from the following detailed description of preferred embodiments, taken together with the accompanying drawings, in which:

TABLE 1 illustrates the relationship between the analog signal and the outputs of the latches in first and second peak detection stages.

DETAILED DESCRIPTION OF THE INVENTION

The present invention provides a multi-stage digital peak detector that has a wider bandwidth than would an equivalent "flash" ADC. Each peak detection stage detects a different sub-range of a full-scale analog signal range. This can be achieved by biasing each stage to detect a different sub-range or by separating identical peak detection stages that detect amplitude levels over the same input range by fixed gain stages. The latter approach is preferred because it minimizes the effects of offset errors in the individual stages. In either case, splitting the peak detector into multiple stages reduces the resistance and number of taps in each stage, which increases their bandwidth. The number of taps can be further reduced by using a non-uniform resolution of the desired full-scale amplitude range. As a result, the peak detector's bandwidth, which is inversely proportional to the product of the resistance and the capacitance, is increased by approximately one order of magnitude.

Figure 1:
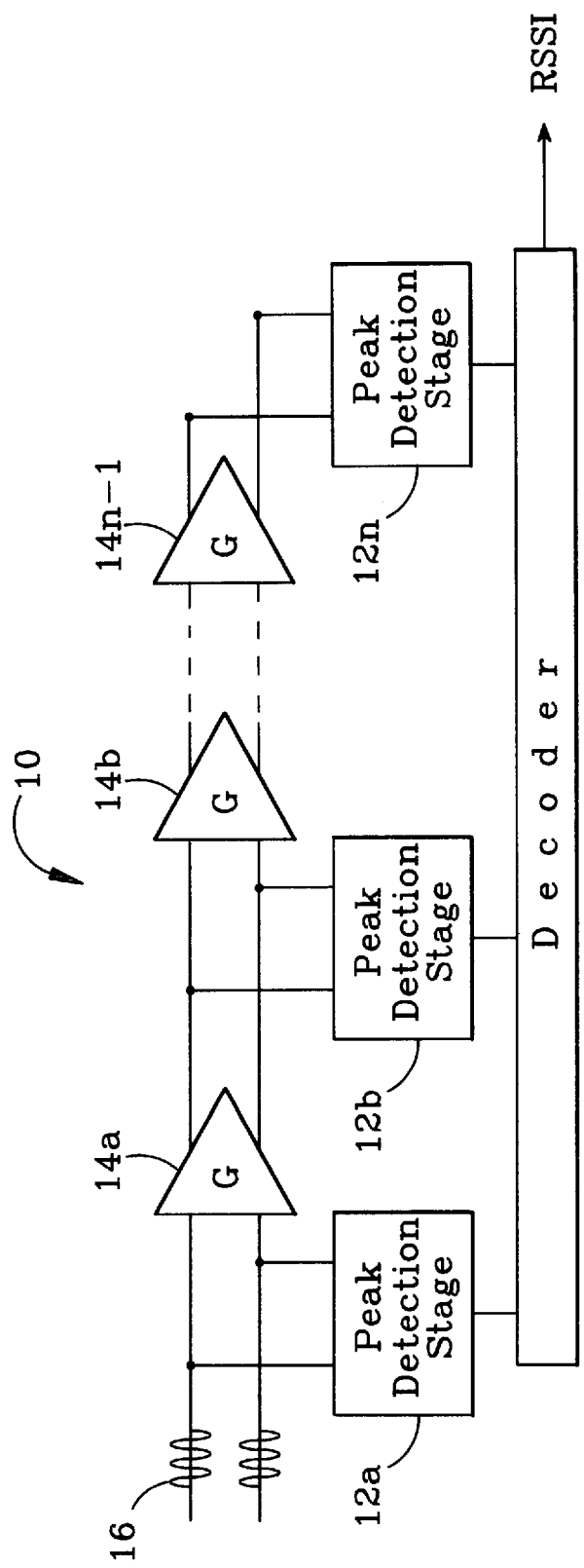
FIG. 1 is a block diagram of a multi-stage digital peak detector in accordance with the present invention.

As shown in FIG. 1, a preferred multi-stage peak detector 10 includes a plurality of peak detection stages 12a, 12b, . . . , 12n that are connected in parallel and respectively separated by a plurality of successive gain stages 14a, 14b, . . . 14n–1. The fixed gain stages are selected to amplify an analog signal 16 so that the peak detection stages detect at least one peak level over different sub-ranges of a full-scale range. In the limit, each peak detection stage would detect only a single peak level. This would maximize the detector's bandwidth but would place high demands on gain stage bandwidth and matching.

A decoder 17 decodes the comparator outputs from the different peak detection stages 12a, 12b, . . . , 12n into a Gray-code Relative Signal Strength Indicators RSSI that represents the signal's peak level over the full-scale input range. Digital hysteresis is preferably used to eliminate level uncertainty at the threshold points in the peak detection stages. Increased resolution may be provided either by increasing the number of bits of resolution in each stage or by adding additional stages. The multi-stage architecture is chosen to optimize a particular application.

For example, a two-stage five level peak detector with six dB of digital hysteresis can be implemented with a 3-tap upper peak detection stage that detects when the signal amplitude exceeds, for example, $1/16$, $1/8$ and $1/4$ the full-scale input range, an 18 dB fixed gain stage, and a 2-tap lower peak detector that detects signal levels that exceed $1/32$ and $1/64$ the full-scale input range. Each tap uses the next lower tap to set its hysteresis. As a result, the lower stage's $1/128$ full-scale tap is used only to provide the digital hysteresis for the $1/64$ tap. If the digital hysteresis were eliminated, the $1/128$ tap could also be used to detect peak levels. In this case, the upper and lower peak detection stages would be identical. The decoder 17 decodes the five comparator and outputs into a 3 bit Gray-code.

By splitting the peak detector 10 into multiple peak detection stages, the number of taps, and thus the capacitance of each stage is reduced, which increases the effective bandwidth of the stage and, hence the detector. Applicant's circuit topology uses only 3 taps to detect peak levels in the upper and lower portions of the full-scale range. A 5-bit "flash" ADC uses 31 taps to detect the same peak levels. Splitting the detector into multiple stages and selecting a non-uniform resolution together reduce the capacitance and, hence the RC time constant, seen at the lowest tap in each peak detection stage such that its bandwidth is increased by at least one order of magnitude.

Splitting the peak detector into multiple stages also reduces the resistance scene at the last tap, which further reduces the RC time constant. In the described two-stage embodiment each peak detection stage has a normalized resistance of 4R. A similar "flash" ADC would have a total resistance of 32R, or 8 times that required by the preferred peak detector. The peak detector's speed is further enhanced by fabricating the stages using a complementary bipolar process.

Figure 2:
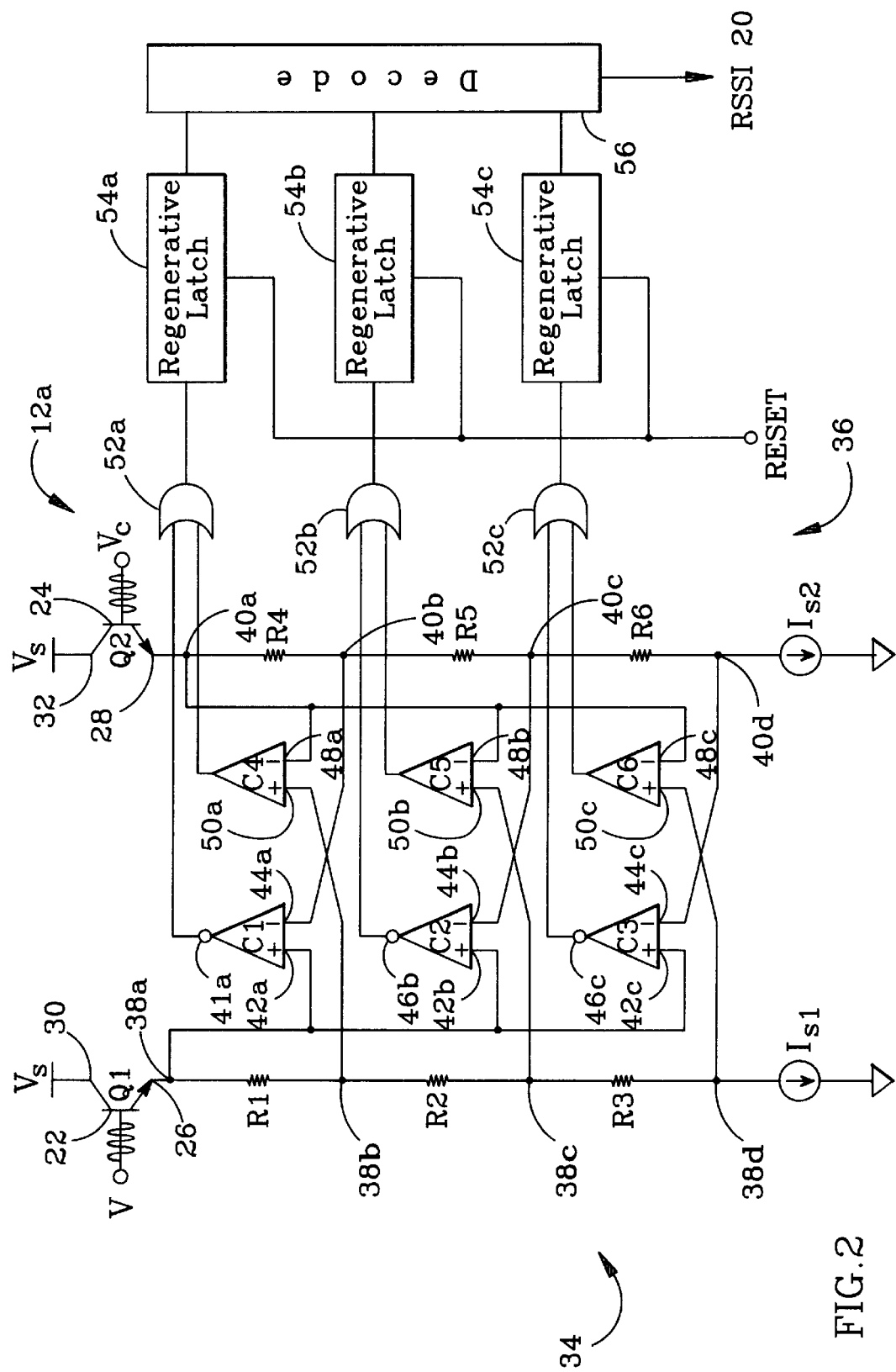
FIG. 2 is a schematic diagram of a complementary bipolar implementation of one of the peak detector stages.

As shown in FIG. 2, a preferred embodiment of a 3-level peak detection stage 12a of the type shown in FIG. 1 detects both positive and negative amplitudes of the analog signal and outputs an RSSI 20 corresponding to the highest preset voltage level crossed during a selected period of the signal. The analog signal is represented by complementary voltage signals V and $V_c$ that are applied differentially to the bases 22 and 24 of npn transistors Q1 and Q2, respectively, such that the voltage signals at their emitters 26 and 28 follow the voltage signals V and $V_c$. Their collectors 30 and 32 are connected to the supply voltage $V_s$, suitably 5 V.

Multi-tap resistive ladders 34 and 36 are connected between Q1's emitter 26 and a current source $I_{s1}$ and Q2's emitter 28 and a current source $I_{s2}$, respectively, to detect the negative and positive peak amplitudes. In the described embodiment, the resistive ladder 34 includes three series connected resistors R1, R2 and R3 with a reference tap 38a at the connection between the ladder and Q1's emitter 26. Taps 38b, 38c and 38d are provided at the series connections between successive resistors to detect the three peak levels in the upper portion of the full-scale input range for negative signal amplitudes. Resistive ladder 36 includes series connected resistors R4, R5 and R6 that provide taps 40a, 40b, 40c and 40d to detect the three peak levels in the upper portion of the full-scale input range for positive signal amplitudes. To set the step-size between successive peak levels at −6 dB, the resistance of each successive resistor is selected so that the total resistance of the ladder doubles at each tap. For example, if resistors R1, R2 and R3 (R4, R5 and R6) have resistances R, R and 2R, the threshold voltage doubles at each successive tap.

A first set of three comparators C1, C2 and C3 for detecting negative peak amplitudes have respective non-inverting inputs 42a, 42b and 42c that are connected to reference tap 38a such that the voltage level at the non-inverting inputs tracks the voltage signal V. The comparators' inverting inputs 44a, 44b and 44c are connected to taps 40b, 40c and 40d, respectively, such that the voltage level at the inverting inputs tracks the complementary voltage signal $V_c$ offset by the threshold voltages across resistors R4, R5 and R6, respectively. Inverters 46a, 46b and 46c are connected to the outputs of the comparators C1, C2 and C3, respectively.

A second set of three comparators C4, C5 and C6 for detecting positive peak amplitudes have respective inverting inputs 48a, 48b and 48c that are connected to reference tap 40a such that the voltage level at the inverting inputs tracks the complementary voltage signal $V_c$. The comparators's non-inverting inputs 50a, 50b and 50c are connected to taps 38b, 38c and 38d, respectively, such that the voltage level at the non-inverting inputs tracks the voltage signal V offset by the threshold voltages across resistors R1, R2 and R3, respectively.

When the differentially driven transistors Q1 and Q2 are at balance, i.e. V—$V_c$=0 V, the voltage levels at the inverting inputs of comparators C1, C2 and C3 are lower than the voltage level at their non-inverting inputs by an amount equal to the threshold voltages across resistors R4, R5 and R6. Therefore, the polarity of the differential input voltage to comparators C1, C2 and C3 is positive, which holds them in a high state and the inverted outputs in a low state. Similarly, the voltage levels at the inverting inputs of comparators C4, C5 and C6 are higher than the voltage level at their non-inverting inputs by an amount equal to the threshold voltages across resistors R1, R2 and R3, which holds their outputs in a low state. Thus, at balance, the detected peak level has a 5-bit digital representation of 00000.

As the magnitude of the differential voltage V—$V_c$ increases and crosses the different threshold voltages, the polarity of the differential input voltage to the individual comparators switches, which causes that comparator to switch state. For example, as the input voltage V starts to go negative, and hence the voltage $V_c$ goes positive, the difference between the voltage signals at the inverting and non-inverting inputs of comparators C1, C2 and C3 is reduced. When the magnitude of the differential voltage crosses the threshold voltage across resistor R4, the polarity of the differential input voltage to comparator C1 becomes negative causing the comparator to switch states so that the inverted output goes high indicating the lowest peak level in the upper portion. The resistance R and the bias current are selected to set the threshold voltages for comparators C1, C2 and C3 at the desired levels. For example, in the two-stage architecture discussed above, the threshold in the upper peak detection stage are set to correspond to $1/8$, $1/4$ and $1/2$ full-scale.

The outputs and inverted outputs of comparators C1 and C4, C2 and C5, and C3 and C6, are respectively applied to two-input OR gates 52a, 52b, and 52c. The OR gates combine the detected positive and negative peak levels to indicate the peak magnitude of the modulated carrier signal. The outputs of the OR gates 52a, 52b, and 52c are applied to regenerative latches 54a, 54b, and 54c, respectively. A decoder 56 reads the outputs of the latches from all of the peak detection stages 14a, 14b, . . . , 14n and generates the RSSI codeword 58 that sets the gain of the programmable attenuator. A reset signal clears the latches at the onset of each successive cycle of an internal clock signal. Thereafter, when one of the comparators is tripped in the first half-cycle of a 2× clock signal, the corresponding latch switches states and remains in that state until it is reset by the next clock cycle. For example, if the signal is greater than quarter-scale, all of the latches in the upper peak detector, as well as those in the lower peak detector, will be set in a high state thereby indicating the maximum peak value 11111. Conversely, if the signal is between 1/16 and 1/32 full-scale, both of the latches in the lower peak detector will be set in a high state but all of the latches in the upper peak detector will remain in the low state (00011).

To implement the hysteresis, a regenerative positive feedback comparator (not shown) is tied to each peak level and referenced to the full-scale input range such that once one of the comparators is tripped it remains in that state until it is reset. The higher peak levels use the threshold voltage from the previous peak level to provide the digital hysteresis. In general, once a comparator is switched high, 1 bit of hysteresis is applied to its input so that the comparator remains in the high state until the magnitude of the signal falls one additional level. This eliminates oscillation back-and-forth between attenuation levels when the signal level is near a threshold voltage. The implementation of a digital hysteresis circuit is well known in the art and therefore will not be discussed further. In the preferred embodiment, the lowest peak detection stage is the same as the upper peak detection stages except that comparators C1 and C4, OR gate 52a, and latch 54a are removed. This is done so that the threshold voltage across resistors R1 and R4 can be used to provide the 1-bit of digital hysteresis for the smallest detected peak level, i.e. 1/128 of full-scale.

Table 1 illustrates the operation of the upper and lower peak detectors for the described two-stage architecture where the full-scale input range of the fixed-range ADC is 1 v peak-to-peak. The magnitude of the analog signal $\Delta V=|V-V_c|$ and the amplified signal are provided in columns 1 and 3. The states of the latches in the first and second peak detection stages are shown in columns 2 and 4. The corresponding RSSI is given in column 5.

While several illustrative embodiments of the invention have been shown and described, numerous variations and alternate embodiments will occur to those skilled in the art. For example, the logic in FIG. 2 could be inverted such that a peak level is detected until it falls below a comparator's reference voltage. Such variations and alternate embodiments are contemplated, and can be made without departing from the spirit and scope of the invention as defined in the appended claims.

We claim:

1. A digital peak detector, comprising:
a plurality of peak detection stages that detect peak amplitude levels of an analog signal in respective sub-ranges of a full-scale amplitude range, each said peak detection stage switching a value of one or more logic states when said analog signal crosses respective amplitude threshold levels in its sub-range and holding the values of said logic states;
a decoder that decodes the values of the logic states into a codeword that represents the signal's peak amplitude level; and
a timing circuit that resets the values of said logic states at each successive cycle of a clock signal so that said peak detection stages detect a next peak amplitude level and said decoder outputs a next codeword at each successive cycle.

2. The digital peak detector of claim 1, wherein each peak detection stage comprises a multi-tap resistive ladder and a biasing circuit that set reference voltage levels at the ladder's taps in one-to-one correspondence with the stage's amplitude threshold levels, each said peak detection stage having a lower RC time constant at its lowest tap than would a single peak detector designed to detect peak levels over said full-scale amplitude range under the same biasing conditions so that each said peak detection stage has a wider bandwidth than said single peak detector.

3. The digital peak detector of claim 2, wherein each multi-tap resistive ladder comprises a plurality of series connected resistors in which the resistance of each successive resistor doubles the total resistance of the ladder at each successive tap so that successive amplitude thresholds correspond to a doubling of the signal amplitude.

4. The digital peak detector of claim 2, wherein said peak detection stages' multi-tap resistive ladders and biasing circuits are the same so that each stage detects amplitude levels over the same input range, further comprising:
one or more fixed gain stages that are connected between each successive pair of peak detection stages to amplify the analog signal so that its amplitude levels in the different sub-ranges are matched to the same input range of the respective peak detection stages.

5. The digital peak detector of claim 1, wherein each peak detection stage comprises one or more comparators that switch the value of the logic states and one or more regenerative latches that hold the switched values until they are reset at the next cycle of the clock signal.

6. A digital peak detector for detecting peak amplitude levels of an analog voltage signal over a full-scale amplitude range, comprising:
a first peak detection stage that detects peak amplitude levels of an analog voltage signal over a first sub-range of a full-scale amplitude range, switches a value of one or more logic states when said analog voltage signal crosses respective amplitude threshold levels in its sub-range and holds the values of said logic states until it is reset at each successive cycle of a clock signal;
a fixed gain stage that amplifies the analog voltage signal so that signal amplitudes in a second sub-range, which together with said first sub-range spans the full-scale amplitude range, are mapped into the first sub-range;
a second peak detection stage that detects peak amplitude levels of the amplified signal over the first sub-range, switches a value of one or more logic states when said amplified signal crosses the respective amplitude threshold levels in the first sub-range, which is equivalent to switching the logic states when the analog voltage signal crosses respective amplitude threshold levels in the second sub-range, and holds the values of said logic states until it is reset at each successive cycle of the clock signal; and
a decoder that decodes the values of the logic states into a codeword that represents the signal's peak amplitude level in the full-scale amplitude range and outputs the codeword at each successive cycle of the clock signal.

7. The digital peak detector of claim 6, wherein said first and second peak detection stages comprise:

a resistive ladder having a number of taps equal to the number of amplitude threshold levels in said first sub-range and less than the total number of amplitude threshold levels in said full-scale amplitude range, the resistance (R) seen at each tap increasing from a minimum value at the uppermost tap to a maximum value at the lowest tap;

a biasing circuit that establishes reference voltage levels at the ladder's respective taps that are equal to the respective amplitude threshold levels in the first sub-range;

a plurality of comparators that compare the amplitude of the voltage signal to the reference voltage levels at the respective taps to switch the logic states, each said comparator providing a capacitance at its tap so that the total capacitance seen at each tap increases from a minimum value at the uppermost tap to a maximum value at the lowest tap, each tap having an RC time constant equal to the produce of the resistance and capacitance seen at that tap; and a plurality of regenerative latches that hold the switched values of the comparators' logic states until they are reset at the next cycle of the clock signal, the bandwidth of said peak detection stages being limited by the RC time constant at their lowest tap, said RC time constant is lower than it would be for a single peak detector designed to detect peak levels over said full-scale amplitude range under the same biasing conditions so that each said peak detection stage has a wider bandwidth than would said single peak detector.

8. A digital peak detector, comprising:

a plurality of peak detection stages that detect peak amplitude levels of an analog signal in respective sub-ranges of a full-scale amplitude range, each said peak detection stage switching a value of one or more logic states when said analog signal crosses respective amplitude threshold levels in its sub-range and holding the values of said logic states, each stage comprising:

a resistive ladder that establishes the amplitude threshold levels at respective taps;

a plurality of comparators that compare the amplitude of the analog signal to the threshold levels at the respective taps to switch the logic states, and a plurality of regenerative latches that hold the switched values of the comparators' logic states until they are reset at the next cycle of a clock signal, and a decoder that decodes the values of the logic states into a codeword that represents the signal's peak amplitude level and outputs the codeword at each successive cycle of the clock signal.

9. The digital peak detector of claim 8, wherein said resistive ladder has a number of taps equal to the number of amplitude threshold levels in each said sub-range and less than the total number of amplitude threshold levels in said full-scale amplitude range, the resistance (R) seen at each tap increasing from a minimum value at the uppermost tap to a maximum value at the lowest tap, and each said comparator providing a capacitance at its tap so that the total capacitance seen at each tap increases from a minimum value at the uppermost tap to a maximum value at the lowest tap, each tap having an RC time constant equal to the product of the resistance and capacitance seen at that tap, the bandwidth of said peak detection stages being limited by the RC time constant at their lowest tap, said RC time constant is lower than it would be for a single peak detector designed to detect peak levels over said full-scale amplitude range under the same biasing conditions so that each said peak detection stage has a wider bandwidth than would said single peak detector.

* * * * *